United States Patent [19]
Nakano

[11] Patent Number: 5,191,333
[45] Date of Patent: Mar. 2, 1993

[54] TWO STAGE DIGITAL TO ANALOG CONNECTING CIRCUIT

[75] Inventor: Masaji Nakano, Tokyo, Japan

[73] Assignee: NEC Corporation, Tokyo, Japan

[21] Appl. No.: 766,715

[22] Filed: Sep. 27, 1991

[30] Foreign Application Priority Data

Sep. 27, 1990 [JP] Japan .................................. 2-259440

[51] Int. Cl.$^5$ ............................................. H03M 1/68
[52] U.S. Cl. ..................................... 341/145; 341/136
[58] Field of Search ........................ 341/144, 145, 136

[56] References Cited

U.S. PATENT DOCUMENTS

| | | | |
|---|---|---|---|
| 3,997,892 | 12/1976 | Susset | 341/136 |
| 4,338,591 | 7/1982 | Tuthill | 341/145 |
| 4,491,825 | 1/1985 | Tuthill | 341/145 |
| 4,918,448 | 4/1990 | Hauviller et al. | 341/145 |
| 5,059,978 | 10/1991 | Valdenaire | 341/145 |

Primary Examiner—Marc Hoff

[57] ABSTRACT

An digital-to-analog converting circuit comprises a reference voltage generating circuit for generating a plurality of different reference voltages, and a reference voltage selection circuit receiving the plurality of reference voltages for supplying two adjacent reference voltages selected in accordance with the most significant portion of a digital signal which should be converted into an analog signal. A digital-to-analog converter receives the two selected reference voltages as the highest level reference voltage and the lowest level reference voltage of the digital-to-analog converter. This digital-to-analog converter is controlled by the remaining portion of the digital signal so as to supply an analog voltage which is obtained by dividing a voltage range from one to the other of the two selected reference voltages into a plurality of voltage levels and by selecting one from the plurality of voltage levels in accordance with the remaining portion of the digital signal.

7 Claims, 6 Drawing Sheets

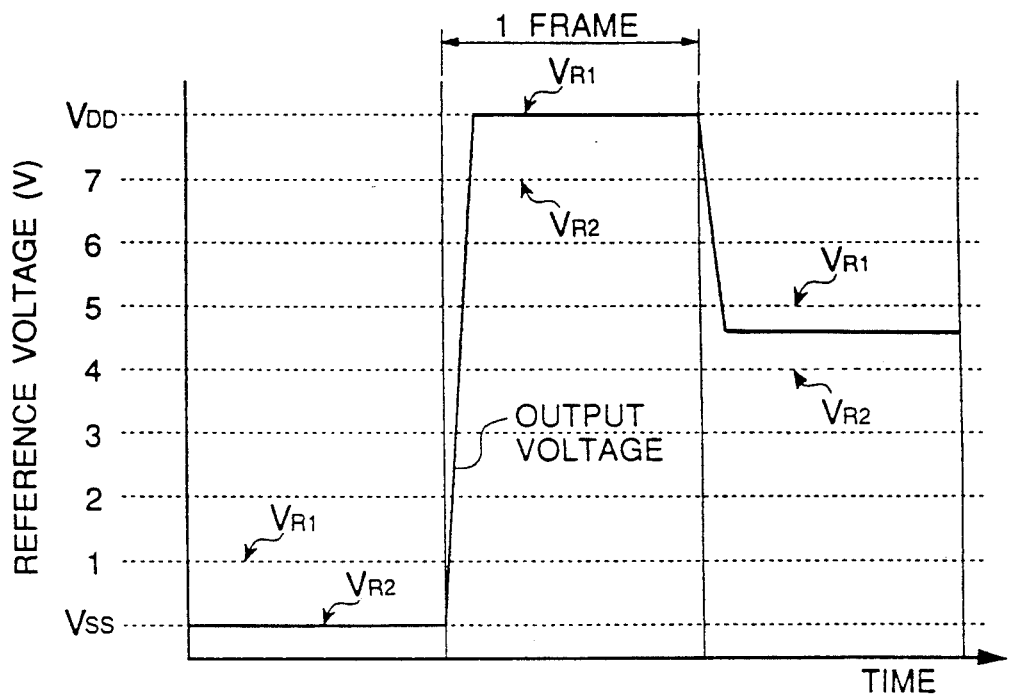

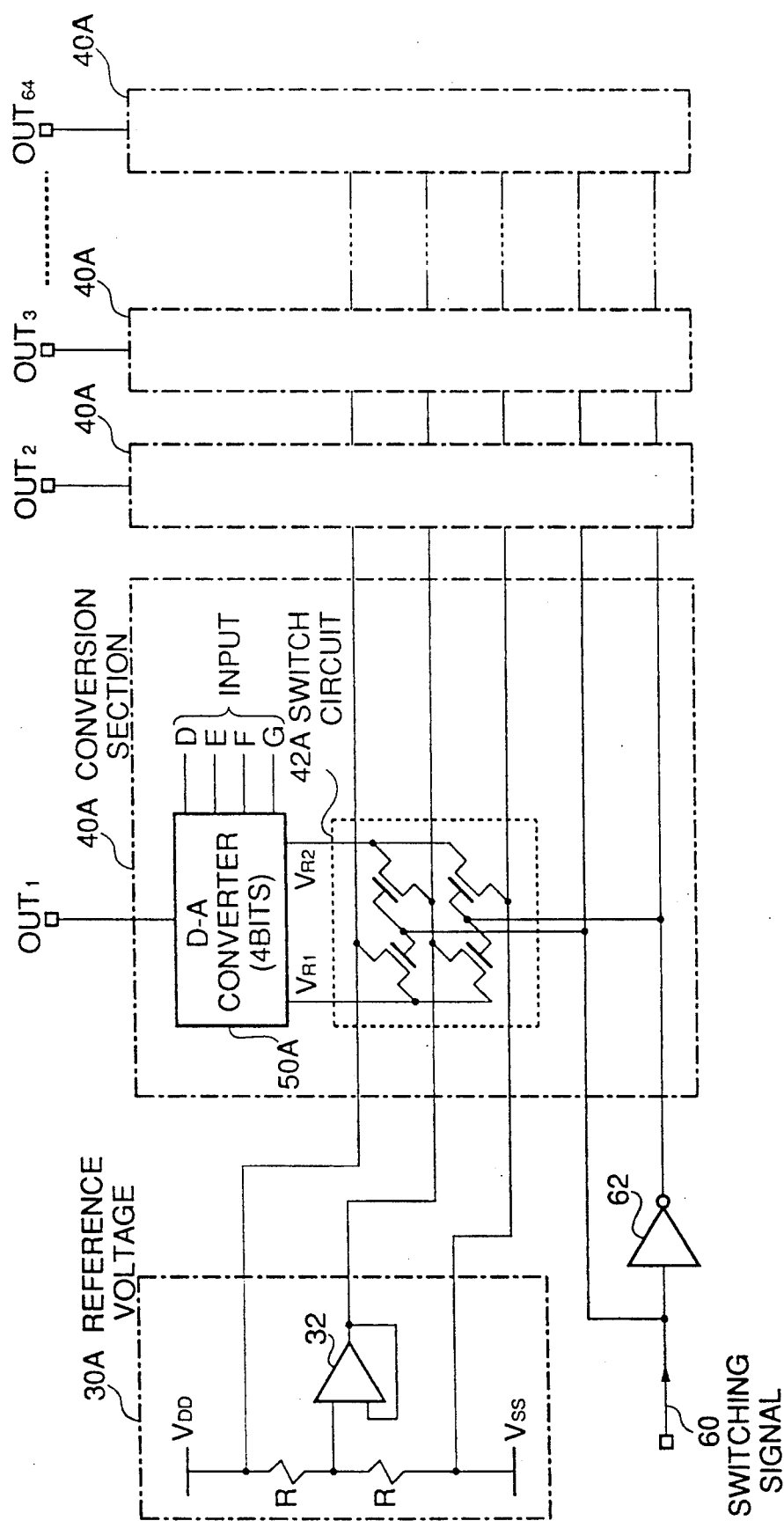

TWO STAGE DIGITAL TO ANALOG CONNECTING CIRCUIT

BACKGROUND OF THE INVENTION

1. Field of the Invention

The present invention relates to a digital-to-analog converting circuit, and more specifically to a digital-to-analog converting circuit for use in a display driving circuit of an active matrix display panel.

2. Description of Related Art

Referring to FIG. 1, one typical conventional digital input/analog output type display drive circuit includes a digital-to-analog converter 10 receiving for example a digital signal of seven bits "A" to "G" for generating an analog signal, a selection shift register 12 receiving a sample pulse, and a sample hold circuit array 14 having a plurality of timing inputs connected to respective stages of the selection shift register 12 and a sampling input connected to receive the analog signal, so that a number of sample hold circuits included in the sample hold circuit array 14 sequentially sample and hold the analog signal at the timing of the sample pulse shifted in the selection shift register 12. As a result, the sample hold circuit array 14 supplies a corresponding number of analog signal outputs $OUT_1$ to $OUT_{64}$ which are sampled at respective sequential timings.

Referring to FIG. 2, another typical conventional digital input/analog output type display drive circuit includes a 7-bit latch array 16 including 64 7-bit latches, each of which latches a 7-bit digital input signal at a sequential timing determined by the selection shift register 12. The 7-bit digital input signal latched in each of the latches is compared with a 7-bit digital signal supplied from a 7-bit incrementer 18, by a corresponding magnitude comparator of a magnitude comparator array 20. The magnitude comparator outputs the result of comparison in the form of a pulse width modulation signal to a corresponding sample hold circuit of the sample hold circuit array 14. Each sample hold circuit of the sample hold circuit array 14 samples and holds a ramp voltage signal generated by a ramp wave generator 22, by the pulse width modulation signal supplied from the corresponding magnitude comparator of the magnitude comparator array 20. Thus, each sample hold circuit of the sample hold circuit array 14 generates an analog signal output $OUT_1$ to $OUT_{64}$ corresponding to the digital input signal.

Referring to FIG. 3, there is shown still another typical conventional digital input/analog output type display drive circuit. In this circuit, the 7-bit digital input signal latched in each of the latches included in the 7-bit latch array 16 are converted into an analog signal by a corresponding digital-to-analog converter of a digital-to-analog converter array 24.

The above mentioned display drive circuits have the sample hold circuit in an output ocction, and therefore, can have only a limited precision in the output analog signal, because the output analog signal is influenced by an offset voltage of the sample hold circuit and noise occurring in a switching operation of the sample hold circuit. In particular, in an active matrix liquid crystal display panel very sensitive to precision in the output voltage, if the output analog voltage has a variation of 50 mV to 100 mV, a striped pattern appears in the display screen.

In addition, in the case that a high precision 7-bit digital analog converter is provided for each output as in the example shown in FIG. 3, a required area is large, and it is difficult to obtain a satisfactory precision.

Furthermore, a voltage of 10 V to 20 V is required for driving the liquid crystal display panel. Therefore, a consumed power in the digital-to-analog converting circuit becomes large.

As seen from the above, the conventional digital-to-analog converting circuit could not sufficiently satisfy the demands for the display driving.

SUMMARY OF THE INVENTION

Accordingly, it is an object of the present invention to provide a digital-to-analog converting circuit which has overcome the above mentioned defect of the conventional ones, and which can sufficiently satisfy the demands for the display driving.

The above and other objects of the present invention are achieved in accordance with the present invention by an digital-to-analog converting circuit comprising a reference voltage generating means for generating a plurality of different reference voltages, a reference voltage selection means receiving the plurality of reference voltages and controlled by a first input signal composed of at least one bit for supplying two reference voltages selected from the plurality of reference voltages in accordance with the first input signal, and a converting means receiving the two selected reference voltages and controlled by a second input signal composed of a plurality of bits for supplying a voltage which is obtained by dividing a voltage range from one to the other of the two selected reference voltages into a plurality of voltage levels and by selecting one of the plurality of voltage levels in accordance with the second input signal.

Preferably, the first input signal is composed of a plurality of bits derived from a more significant portion of a digital signal which should be converted into an analog signal, and the second input signal is derived from a less significant portion of the digital signal. More preferably, the first input signal is composed of a plurality of bits of the most significant portion of the digital signal which should be converted into an analog signal, and the second input signal is composed of a plurality of bits of the remaining portion of the digital signal.

In one embodiment, the reference voltage selection means includes a decoder receiving the first input signal for generating a plurality of control signals, and a switching circuit coupled to receive the plurality of reference voltages from the reference voltage generating means and controlled by the plurality of control signals for selecting, in accordance with an active signal included in the plurality of control signals, two reference voltages from the plurality of reference voltages, the two selected reference voltages being adjacent to each other in the order of magnitude of the plurality of reference voltages.

In another embodiment, the reference voltage generating means generates three different reference voltages, and the reference voltage selection means includes a decoder receiving the first input signal of one bit as a switching signal for generating two control signals composed of the one bit and an inverted bit of the one bit, and a switching circuit coupled to receive the three reference voltages from the reference voltage generating means and controlled by the two control signals for selecting, in accordance with an active signal of the two control signals, two reference voltages from the three reference voltages, the two selected reference voltages being adjacent to each other in the order of magnitude of the three reference voltages.

As seen from the above, based on the first input signal composed of a plurality of bits, the reference voltage selection means for selecting two reference voltages from the plurality of reference voltages, and the converting means divides a voltage range from one to the other of the two selected reference voltages into a plurality of voltage levels.

Therefore, it is sufficient if the digital-to-analog converting circuit can divide a limited voltage range from one to the other of the two selected reference voltages, into a plurality of voltage levels. Therefore, the digital-to-analog converting circuit is sufficient if it has a small scale on the order of for example four bits, and accordingly, a high precision output can be obtained with a low consumed power.

On the other hand, the reference voltage selection means can be simply constituted of a decoder for decoding the input signal composed of a plurality of bits so as to generate a plurality of control signals, and a switching circuit controlled by the control signals.

In addition, in the case that the digital-to-analog converting circuit is used in a display drive circuit capable of outputting only two levels of tone or gradation, the reference voltage generating means can be composed to be able to generate three different reference voltages, and the reference voltage selection means can be simply constituted to select two reference voltages from the three reference voltages.

The above and other objects, features and advantages of the present invention will be apparent from the following description of preferred embodiments of the invention with reference to the accompanying drawings.

BRIEF DESCRIPTION OF THE DRAWINGS

FIGS. 5A and 5B illustrate an operation timing of the digital-to-analog converting circuit shown in FIG. 4; and FIG. 6 is a block diagram of another embodiment of the digital-to-analog converting circuit in accordance with the present invention used in a digital input/analog output type display drive circuit.

DESCRIPTION OF THE PREFERRED EMBODIMENTS

Figure 4:
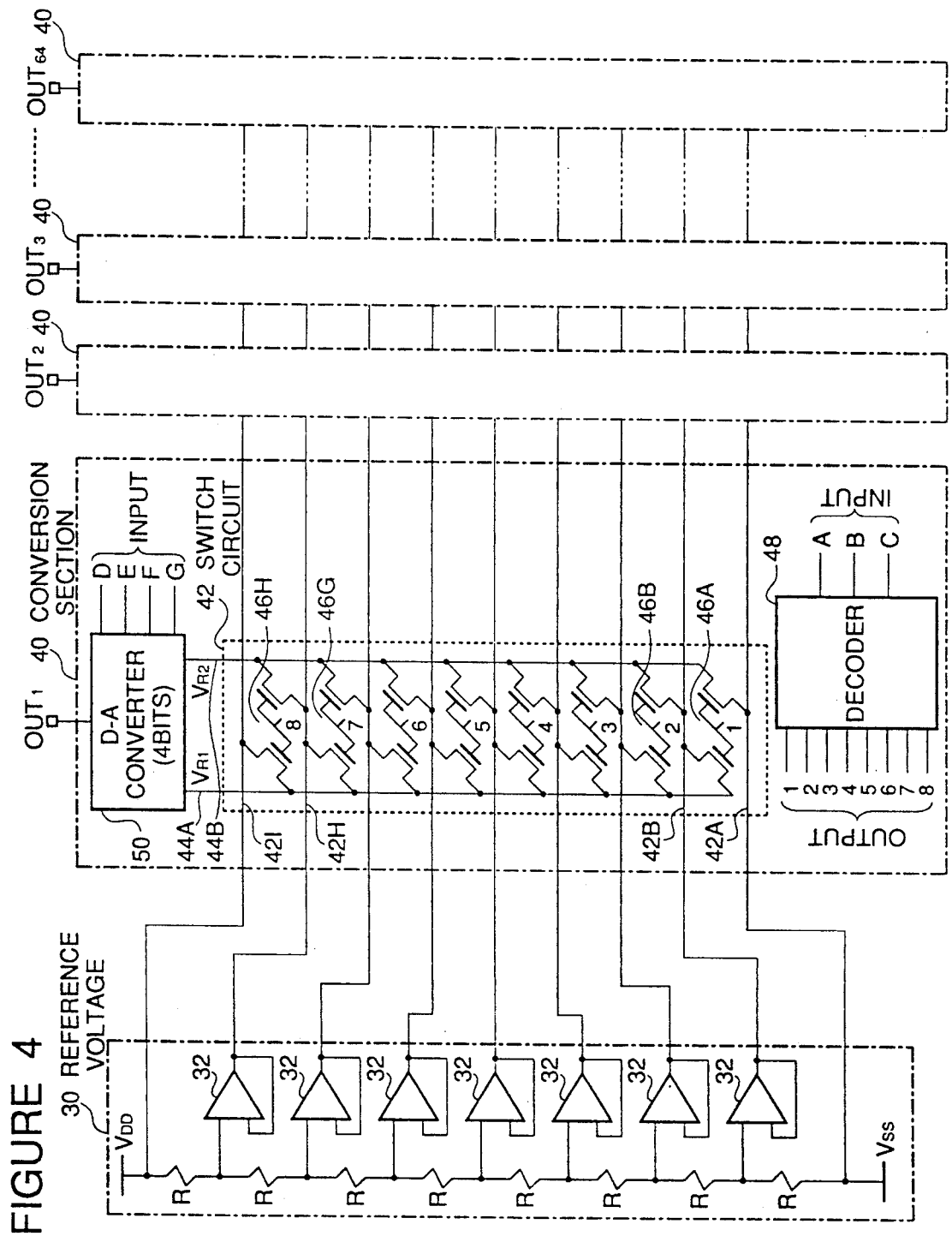
FIG. 4 is a block diagram of one embodiment of the digital-to-analog converting circuit in accordance with the present invention used in a digital input/analog output type display drive circuit.

Referring to FIG. 4, there is shown a block diagram of one embodiment of the digital-to-analog converting circuit in accordance with the present invention used in a digital input/analog output type display drive circuit.

The shown circuit includes a reference voltage source 30 including eight resistors R connected in series between the highest level reference voltage $V_{DD}$ and the lowest level reference voltage $V_{SS}$, and seven differential amplifiers 32 having an input connected to a connection node between a corresponding pair of adjacent resistors R. With this arrangement, nine different reference voltages are supplied from the highest level reference voltage $V_{DD}$, respective outputs of the seven differential amplifiers 32 and the lowest level reference voltage $V_{SS}$.

The nine different reference voltages are supplied to a switch circuit 42 included in each of 64 conversion circuits 40 having outputs $OUT_1$ to $OUT_{64}$, respectively.

The switch circuit 42 is configured to receive the nine different reference voltages and to select and output a pair of adjacent different reference voltages. For this purpose, the switch circuit 42 includes nine input lines 42A to 42I and a pair of output lines 44A and 44B, and eight MOS transistor pairs 46A to 46H connected between the nine input lines 42A to 42I and the two output lines 44A and 44B so that a pair of adjacent input lines are selected from the nine input lines 42A to 42I and connected to the two output lines 44A and 44B. For example, a first MOS transistor of each of the eight MOS transistor pairs 46A to 46H is connected at its one end in common to the output line 44A, and a second MOS transistor of each of the eight MOS transistor pairs 46A to 46H is connected at its one end in common to the output line 44B. The respective first MOS transistors of the eight MOS transistor pairs 46A to 46H are connected at their other end to the input lines 42B to 42I, respectively, and the respective second MOS transistors of the eight MOS transistor pairs 46A to 46H are connected at their other end to the input lines 42A to 42H, respectively. A pair of MOS transistors in each of the eight MOS transistor pairs 46A to 46H have their gate connected in common to receive a corresponding one of eight control signals "1" to "8" generated by a decoder 48.

This decoder 48 receives an input signal of three bits "A", "B" and "C", which are constituted of three more significant bits of an 7-bit input digital signal. The decoder 48 activates only one control signal designated by the received input signal of three bits.

On the other hand, two selected reference voltages $V_{R1}$ and $V_{R2}$ are supplied from the output lines 44A and 44B to a four-bit digital-to-analog converter 50 as the highest level reference voltage and the lowest level reference voltage of the digital-to-analog converter 50. This digital-to-analog converter 50 also receives a digital input signal of four bits "D", "E", "F", and "G", which are constituted of four less significant bits of the 7-bit input digital signal. This digital to analog converter 50 operates to divide a limited voltage range from one to the other of the two selected reference voltages $V_{R1}$ and $V_{R2}$ into 16 voltage levels, to select one of 16 voltage levels in accordance with the digital input signal of four bits so as to output the selected voltage level to the corresponding output OUTi. This selected voltage level outputted to the output terminal OUTi can be expressed as $V_{R2}+\{N(V_{R1}-V_{R2})/16\}$ (where N=0 to 15). N is designated by the four bits "D", "E", "F", and "G" of the digital input signal.

Now, operation of the above mentioned digital-to-analog converting circuit will be descirbed with reference to FIGS. 5A and 5B. FIG. 5A shows an analog voltage outputted from the output terminal OUTi of the four-bit digital-to-analog converter 50, and FIG. 5B shows the input digital signal.

From the nine different reference voltages "$V_{DD}$", "7", "6", "5", "4", "3", "2", "1" $V_{SS}$", two adjacent reference voltages $V_{R1}$ and $V_{R2}$ are selected by the switch circuit 40 controlled by the 3-input 8-output decoder 48, and then supplied to the four-bit digital-to-analog converter 50.

Figure 3:
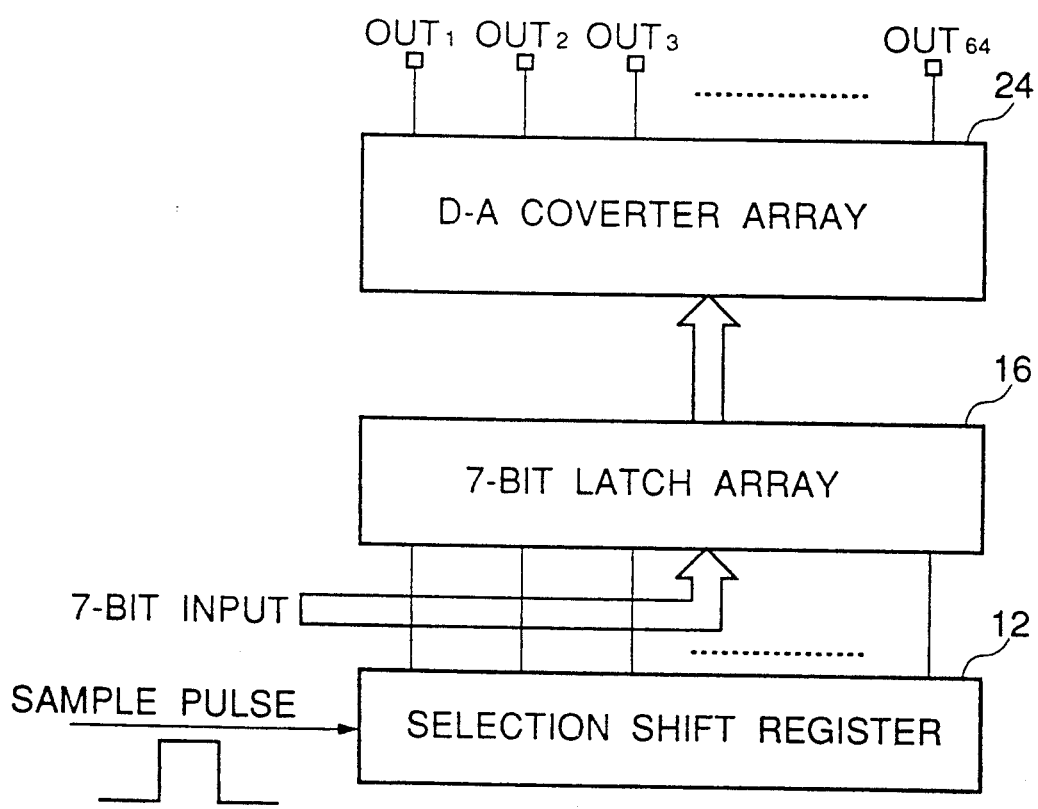

Here, as seen from the above, the digital input signals of the decoder 48 and the digital-to-analog converter 50 are formed as a whole of a digital signal of seven bits "A" to "G" which are supplied as a digital data signal in the circuit shown in FIG. 3 and latched in the 7-bit latch array 16.

The three more significant bits "A" to "C" of the seven-bit digital input signal are supplied to the decoder 48, and one MOS transistor pair of the eight MOS transistor pairs 46A to 46H within the switch circuit 42 is selected and turned on by one active control signal of the eight control signals "1" to "8" outputted from the decoder 48, so that two selected reference voltages $V_{R1}$ and $V_{R2}$ are supplied to the four-bit digital-to-analog converter 50.

In the digital-to-analog converter 50, analog signals of 16 levels are generated by using the selected reference voltages $V_{R1}$ and $V_{R2}$ as the highest voltage and the lowest voltage, and one analog signal is selected from the analog signals of 16 levels in accordance with the less significant bits "D" to "G" of the seven-bit digital input signal.

In the example shown in FIGS. 5A and 5B, the seven bits "A" to "G" of the seven-bit digital input signal are all "0" in a first frame, and therefore, the level "1" and the level "$V_{SS}$ a selected as $V_{R1}$ and $V_{R2}$, respectively, and the output analog voltage becomes $V_{SS}$. In a second frame, the seven bits "A" to "G" of the seven-bit digital input signal are all "1", and therefore, the level "$V_{DD}$" and the level "7" are selected as $V_{R1}$ and $V_{R2}$, respectively, and the output analog voltage becomes $V_{DD}$. In a third frame, the bits "A", "B" and "C" of the seven-bit digital input signal are "1", "0" and "0", respectively, and the bits "D", "E", "F" and "G" of the seven-bit digital input signal are "1", "0", "0" and "0". Therefore, the level "5" and the level "4" are selected as $V_{R1}$ and $V_{R2}$, respectively, and the output analog voltage becomes at a level between the level "5" and the level "4".

Figure 1:
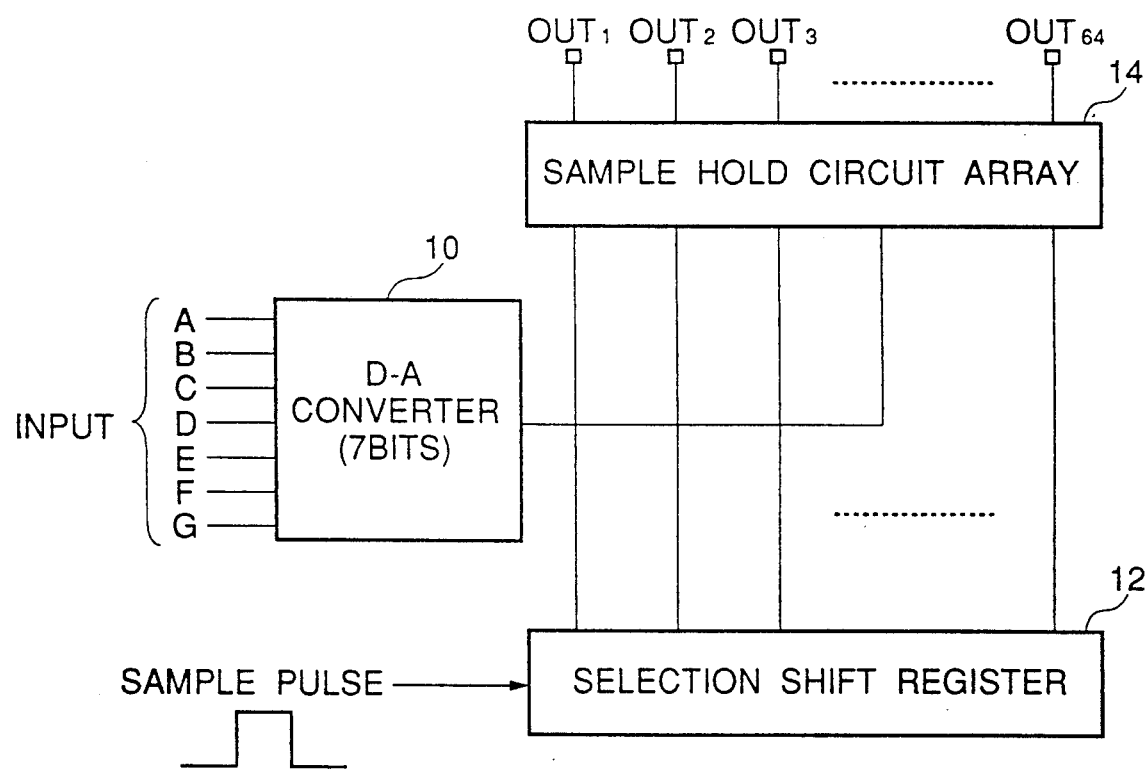
FIGS. 1 to 3 are block diagrams of conventional digital input/analog output type display drive circuits.
Figure 2:
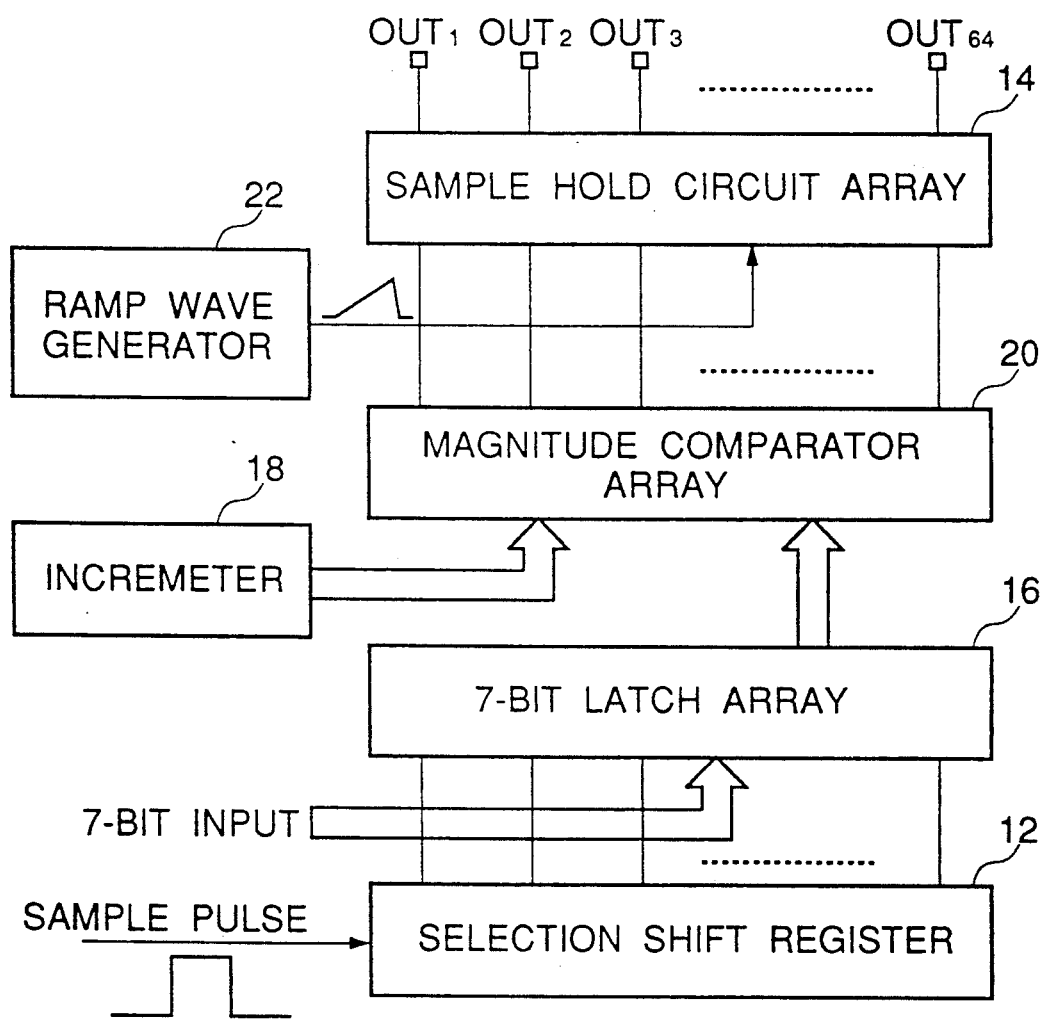

As seen from the above, the above mentioned first embodiment does not use the sample hold circuit which is used in the convention examples shown in FIGS. 1 and 2. In addition, the above mentioned first embodiment can be mainly constituted of the four-bit digital-to-analog converters, in place of the digital-to-analog converter array composed of 64 seven-bit digital-to-analog converters as used in the conventional example shown in FIG. 3. Therefore, the circuit can be simplified, and the consumed electric power can be decreased. In addition, precision of the output analog voltage can be elevated.

Referring to FIG. 6, there is shown a block diagram of another embodiment of the digital-to-analog converting circuit in accordance with the present invention used in a digital input/analog output type display drive circuit.

In particular, in the case of the liquid crystal display panel, the polarity of the driving signal is alternatively inverted by each one frame or each one field. In this case, all of the output signals in one frame or field becomes either higher or lower than an intermediate potential level. Therefore, one bit of the switching signal for the reference voltage source can be composed of a signal in common to all of the output signals in one frame or field.

The second embodiment is based on the assumption that, in addition to the polarity inversion, upper 16 levels of tone or graduation exist in an extent higher than an mid-point voltage of the reference voltage source, and lower 16 levels of tone or gradation exist in an extent lower than an mid-point voltage of the reference voltage source. Under this assumption, the digital-to-analog converting circuit can be simplified in construction, and a latch circuit corresponding to one bit can be omitted.

In FIG. 6, elements similar or corresponding to those shown in FIG. 4 are given the same Reference Numerals, and added with the suffix "A".

The reference voltage source 30A generates three different reference voltages, which are supplied to a switch circuit 42A, where two of the three different reference voltages are selected and supplied to the four-bit digital-to-analog converter 50A. In place of the bits "A" to "C" of the digital input signal, a switching signal 60 is supplied to an inverter 62, so that the switch circuit 42A is controlled by the switching signal 60 and an output of the inverter 62.

As seen from the above, if the digital-to-analog converting circuit in accordance with the present invention is incorporated in the display drive circuit, it is possible to supply an analog output signal having the precision higher than that of the display drive circuit in which the analog signal is sampled and held in the sample hold circuit and an output analog signal is supplied from in the sample hold circuit. In addition, the digital-to-analog converting circuit in accordance with the present invention can be realized at an area smaller than the case using the high precision seven-bit digital-to-analog converter for each analog output. Furthermore, since the digital-to-analog conversion is executed in a relatively narrow voltage range from one to the other of the two adjacent reference voltages, the consumed electric power can be remarkably reduced. This is very advantageous.

The invention has thus been shown and described with reference to the specific embodiments. However, it should be noted that the present invention is in no way limited to the details of the illustrated structures but changes and modifications may be made within the scope of the appended claims.

I claim:

1. An digital-to-analog converting circuit comprising a reference voltage generating means for generating a plurality of different reference voltages, a reference voltage selection means receiving said plurality of reference voltages and controlled by a first input signal composed of at least one bit for supplying two reference voltages selected from said plurality of reference voltages in accordance with said first input signal, and a converting means receiving said two selected reference voltages and controlled by a second input signal composed of a plurality of bits for supplying a voltage which is obtained by dividing a voltage range from one to the other of said two selected reference voltages into a plurality of voltage levels and by selecting one of said plurality of voltage levels in accordance with said second input signal, wherein said reference voltage generating means generates three different reference voltages, and said reference voltage selection means includes a decoder receiving said first input signal of one bit as a switching signal for generating two control signals composed of said one bit and an inverted bit of said one bit, and a switching circuit coupled to receive said three reference voltages from said reference voltage generating means and controlled by said two control signals for selecting, in accordance with an active signal of said two control signals, two reference voltages from said three reference voltages, said two selected reference voltages being adjacent to each other in the order of magnitude of said three reference voltages.

2. An digital-to-analog converting circuit claimed in claim 1 wherein said first input signal is composed of a plurality of bits derived from a more significant portion of a digital signal which should be converted into an analog signal, and said second input signal is derived from a less significant portion of said digital signal.

3. An digital-to-analog converting circuit claimed in claim 1 wherein said first input signal is composed of a plurality of bits of the most significant portion of a digital signal which should be converted into an analog signal, and said second input signal is composed of a plurality of bits of the remaining portion of said digital signal.

4. An analog-to-digital converting circuit claimed in claim 1 wherein said switching circuit includes a plurality of MOS transistor pairs connected between input lines from said reference voltage generating means and output lines connected to said converting means receiving said two selected reference voltages via said output lines from said switching circuit.

5. An analog-to-digital converting circuit claimed in claim 4 wherein said MOS transistors in each pair have gates thereof connected in common to receive a respective control signal from said decoder.

6. An analog-to-digital converting circuit claimed in claim 1 wherein said converting means includes at least one digital-to-analog converter.

7. An analog-to-digital converting circuit claimed in claim 6 wherein said converter is a four-bit digital-to-analog converter.

* * * * *